United States Patent
Stecher et al.

(10) Patent No.: US 8,749,018 B2
(45) Date of Patent: Jun. 10, 2014

(54) INTEGRATED SEMICONDUCTOR DEVICE HAVING AN INSULATING STRUCTURE AND A MANUFACTURING METHOD

(75) Inventors: Matthias Stecher, Munich (DE); Hans Weber, Bayerisch Gmain (DE); Lincoln O'Riain, Dresden (DE); Birgit von Ehrenwall, Radebeul (DE)

(73) Assignee: Infineon Technologies AG, Neubiberg (DE)

( * ) Notice: Subject to any disclaimer, the term of this patent is extended or adjusted under 35 U.S.C. 154(b) by 769 days.

(21) Appl. No.: 12/819,856

(22) Filed: Jun. 21, 2010

(65) Prior Publication Data

US 2011/0309441 A1    Dec. 22, 2011

(51) Int. Cl.
*H01L 21/70* (2006.01)

(52) U.S. Cl.
USPC ............... 257/500; 257/505; 257/E27.014

(58) Field of Classification Search
USPC ............ 257/355, 500, 501, 505, 508, 359, 257/E27.014
See application file for complete search history.

(56) References Cited

U.S. PATENT DOCUMENTS

| | | | |
|---|---|---|---|
| 4,353,085 A | | 10/1982 | Sakurai |
| 4,819,052 A | * | 4/1989 | Hutter ........................... 257/508 |
| 4,851,366 A | * | 7/1989 | Blanchard ..................... 438/405 |
| 4,920,396 A | | 4/1990 | Shinohara et al. |
| 4,980,747 A | * | 12/1990 | Hutter et al. .................. 257/513 |
| 5,442,223 A | * | 8/1995 | Fujii ............................. 257/508 |
| 5,847,438 A | * | 12/1998 | Kikuchi et al. ............... 257/505 |
| 6,004,406 A | * | 12/1999 | Kobayashi et al. ........... 257/505 |
| 7,459,365 B2 | | 12/2008 | Rueb et al. |
| 7,560,322 B2 | | 7/2009 | Clarke et al. |
| 7,598,128 B2 | * | 10/2009 | Hsu et al. ...................... 438/140 |
| 8,093,677 B2 | * | 1/2012 | Stecher et al. ................ 257/508 |
| 2002/0003260 A1 | * | 1/2002 | Murakami ..................... 257/347 |
| 2005/0212071 A1 | * | 9/2005 | Yue et al. ...................... 257/452 |

FOREIGN PATENT DOCUMENTS

| | | |
|---|---|---|
| DE | 102005046711 A1 | 4/2007 |
| DE | 102006031538 A1 | 1/2008 |

OTHER PUBLICATIONS

"Partial SOI Structure by Wafer Direct Bonding through Amorphous Layer", H. Himi, et al., ECS Transactions 2008 (6 pgs.).

* cited by examiner

*Primary Examiner* — Stephen W Smoot
*Assistant Examiner* — Sun M Kim
(74) *Attorney, Agent, or Firm* — Dicke, Billig & Czaja, PLLC

(57) ABSTRACT

An integrated semiconductor device is provided. The integrated semiconductor device has a first semiconductor region of a second conductivity type, a second semiconductor region of a first conductivity type forming a pn-junction with the first semiconductor region, a non-monocrystalline semiconductor layer of the first conductivity type arranged on the second semiconductor region, a first well and at least one second well of the first conductivity type arranged on the non-monocrystalline semiconductor layer and an insulating structure insulating the first well from the at least one second well and the non-monocrystalline semiconductor layer. Further, a method for forming a semiconductor device is provided.

20 Claims, 16 Drawing Sheets

INTEGRATED SEMICONDUCTOR DEVICE HAVING AN INSULATING STRUCTURE AND A MANUFACTURING METHOD

BACKGROUND

This specification refers to integrated semiconductor devices, in one embodiment to lateral power integrated semiconductor devices and a manufacturing method therefor.

Many functions of modern devices in automotive, consumer and industrial applications such as driving a motor or an electric machine are controlled by Electronic Control Units (ECUs). In automobiles, for example, igniting an airbag, switching the valves of an ABS on and off, and injecting fuel into the cylinders of the motor are activated and regulated, respectively, by different decentralized ECUs. Even many home appliances like a washing machine and a dish washer are controlled by ECUs. Typically, an ECU includes analog, digital and power modules and at least one microcontroller (μC). To minimize cost, size and weight of the electronics, the digital and analog circuits of an ECU are typically monolithically integrated on a common substrate as a single integrated circuit (IC). Depending on application, this can e.g., be achieved in a HV-CMOS technology or in a smart power technology. While HV-CMOS technology combines high-voltage MOS (HV-MOS) and CMOS transistors, smart power technology offers in addition bipolar transistors for high precision analog functions, and DMOS transistors to drive loads up to several amperes.

ESD pulses (ESD=electrostatic discharge) occurring during assembly and energetic electric pulses during operation, e.g., due to switching of actuators, should not lead to malfunction or destruction of an ECU. Even simple actuators such as a contact bouncing relay generate repeating overvoltage pulses with fast rise and fall times. With inductive loads, negative voltages may occur during reverse currents as well. Energetic electric pulses typically last a few nanoseconds up to several milliseconds. Many of these pulses have been standardized in the ISO-7637. Some of these pulses which are in the range of nanoseconds are similar to ESD pulses. Even if the pulses do not destroy the other modules, such pulses may induce noise into the substrate ("substrate potential fluctuations") and hence function as a noise source for the other modules. This may result in a shift of the operating point or a complete intermittent fault of these modules during operation. For example, negative voltage pulses injected into a motor driver module, in particular for drive loads in the ampere range, may provide a significant noise source for an analog measuring module and/or a logic module and/or a further driver module.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

A full and enabling disclosure of the present invention, including the best mode thereof, to one of ordinary skill in the art, is set forth more particularly in the remainder of the specification, including reference to the accompanying figures. Therein.

DETAILED DESCRIPTION

Figure 1:
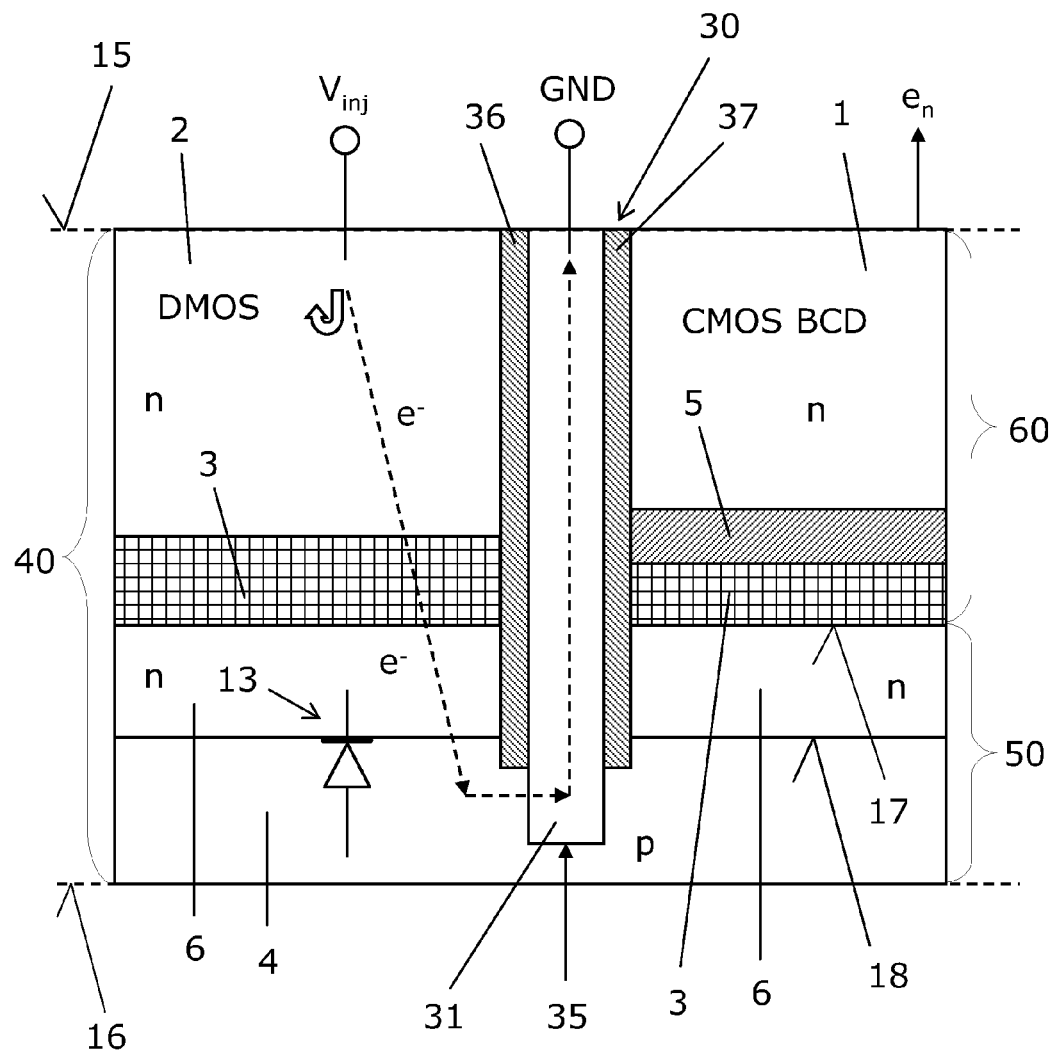
FIG. 1 schematically illustrates a vertical cross-section of a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide for integrated devices having protection between modules or circuits. To ensure high reliability it is, therefore, desirable to efficiently insulate or decouple the different modules of the IC from each other. In so doing, any cross-talk between the modules is eliminated or at least reduced. Consequently, a pulse which is injected into one module of the IC is mainly dissipated or absorbed within the respective module. Thereby, the other modules can be protected. This is particularly important in automotive electronics for which the reliability requirements are one or two orders of magnitude higher above those of standard technologies. Insulating the modules of an IC from each other reduces, in addition, the cross-talk between the different modules over the common substrate which results from the operation of the modules themselves. Typically, this cross-talk becomes more important with increasing level of integration. Furthermore, insulating the modules on chip level reduces costs as the protection elements are integrated into the ICs.

According to one embodiment, a lateral power integrated circuit having a semiconductor body is provided. The semiconductor body includes a first and a second well of a first conductivity type which extend to a first horizontal surface. The first well includes in a lower portion a buried layer of the first conductivity type and has a doping concentration which exceeds the doping concentration of an upper portion. The second well includes a lateral power semiconductor structure. The semiconductor body further includes a first semiconductor region of a second conductivity type which extends to a second horizontal surface which is opposite to the first horizontal surface. Further, a silicon layer is arranged between the first horizontal surface and the first semiconductor region. The silicon layer includes at least one of poly-Si and α-Si. An insulating region insulates the first well and the silicon layer from one another. A vertical trench which extends from the first horizontal surface at least to the insulating region insulates the first and the second well from one another.

According to one embodiment, an integrated semiconductor device having a semiconductor body is provided. The semiconductor body includes a first semiconductor region of a second conductivity type and a second semiconductor region of a first conductivity type forming a pn-junction with the first semiconductor region. A non-monocrystalline semiconductor layer of the first conductivity type is arranged on the second semiconductor region. The semiconductor body further includes a first well and at least one second well of the first conductivity type which are arranged on the non-monocrystalline semiconductor layer and extend to the main horizontal surface. An insulating structure insulates the first well from the at least one second well and the non-monocrystalline semiconductor layer.

According to one embodiment, a semiconductor device having a semiconductor body is provided. The semiconductor body includes a main horizontal surface, a back surface arranged opposite to the main horizontal surface, a first and a second well extending to the main horizontal surface, an embedded silicon region arranged below the first well, and a pn-junction arranged between the embedded silicon region and the back surface. The second well includes a DMOS-structure. The first well is insulated from the second well and includes at least one of a CMOS-structure and a low power BCD-structure. The embedded silicon region is insulated from the first well and includes at least one of poly-Si and α-Si.

According to one embodiment, a method for forming a power integrated circuit is provided. The method includes providing a first wafer having a first horizontal surface, an opposite horizontal surface, and a semiconductor layer extending from the first horizontal surface to the opposite horizontal surface. At least one insulating region is formed on the opposite horizontal surface such that the insulating region partly covers the semiconductor layer. A non-monocrystalline semiconductor layer is formed on the opposite horizontal surface such that the non-monocrystalline semiconductor layer covers at least the semiconductor layer. A second wafer having a pn-junction is provided. The method further includes waferbonding of the first wafer and the second wafer such that an interface between the non-monocrystalline semiconductor layer and the second wafer is formed.

According to one embodiment, a method for forming a semiconductor device is provided. The method includes providing a partial SOI wafer having a semiconductor layer and a partial oxide layer. A non-monocrystalline silicon-layer is maskless deposited on the SOI wafer such that the partial oxide layer is covered. A second wafer having a pn-junction is provided. A wafer-stack is formed by waferbonding of the partial SOI and second wafer such that non-monocrystalline Si-layer is embedded in the wafer-stack. A first well and a second well are formed in the semiconductor layer such that the first well is insulated from the non-monocrystalline silicon-layer and the second well. At least one of a CMOS-structure and a low-power BCD-structure is formed in the first well and a power semiconductor structure is formed in the second well.

Further embodiments, modifications and improvements of the semiconductor device and methods for forming the semiconductor devices will become more apparent from the following description and the appending claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The term "horizontal" as used in this specification intends to describe an orientation parallel to a first or main surface of a semiconductor substrate or body. This can be for instance the surface of a wafer or a die.

The term "vertical" as used in this specification intends to describe an orientation which is arranged perpendicular to the first surface, i.e., parallel to the normal direction of the first surface, of the semiconductor substrate or body.

In this specification, n-doped is referred to as a first conductivity type while p-doped is referred to as a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$ regions can have different absolute doping concentrations. The same applies, for example, to an n$^-$ and a p$^+$ region.

Specific embodiments described in this specification pertain to, without being limited thereto, integrated semiconductor devices, in one embodiment to lateral smart power integrated semiconductor devices. The terms "smart power integrated circuit" and "smart power integrated device" as used in this specification intends to describe a semiconductor device that combines low voltage devices or circuitry, mostly CMOS, and/or low power devices or circuitry such as low power BCD with high voltage and/or high current switching devices on a single chip. In other words, smart power integrated circuits or devices are intended for high current, typically in the Ampere range, and/or high voltages, typically above 400 V, more typically about 500 V and combine power semiconductor technology with low voltage, high density circuitry, i.e., IC technology such as Large Scale Integration (LSI) technology or even Very Large Scale Integration (VLSI) technology, on a single chip. Examples of smart power integrated circuits include, motor drivers for various types, switch drivers, off line circuits, bridge driver and complete power switching regulators for computer peripheral, industrial and automotive applications. Furthermore, several power drivers, e.g., a solenoid driver and a motor driver, may be integrated on a single chip in a smart power IC. Smart power ICs are typically combined with a micro-controller in Electronic Control Units. Within this specification, the terms "smart power integrated circuit" and "power integrated circuit" are used synonymously. Further, the terms "smart power integrated device" and "power integrated device" are used synonymously. The terms "lateral integrated circuit" and "lateral semiconductor device" as used in this specification intend to describe an integrated circuit and a semiconductor device, respectively, having a semiconductor body or semiconductor substrate with a main surface, a source contact and a drain contact which are both arranged on the main surface, and/or an anode contact and a cathode contact which are both arranged on the main surface, and/or an emitter contact and a collector contact which are both arranged on the main surface. The terms "lateral integrated circuit" and "lateral semiconductor device" as used in this specification shall also embrace quasi-vertical circuits and semiconductor devices, respectively.

FIG. 1 illustrates an embodiment of a semiconductor device 100 in a section of a vertical cross-section. The semiconductor device 100 includes a semiconductor body 40 having a first or main surface 15 and a second surface 16 or back surface 16 arranged opposite to the first surface 15. The normal direction $e_n$ of the first surface 15 is substantially parallel to, i.e., defines, the vertical direction.

In the following, embodiments pertaining to semiconductor devices and manufacturing methods therefor, respectively, are explained with reference to silicon (Si) semiconductor devices. Accordingly, a monocrystalline semiconductor region or layer is typically a monocrystalline Si-region or Si-layer. Likewise, a non-monocrystalline semiconductor region or layer is typically a non-monocrystalline Si-region or Si-layer. A non-monocrystalline Si-region or Si-layer is typically made of polycrystalline silicon, in the following also referred to as poly-Si, and/or amorphous silicon, in the following also referred to as α-Si. It should however be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon-silicon carbide ($Si_xC_{1-x}$) and SiGe heterojunction semiconductor material. For power semiconductor applications currently mainly Si, SiC and GaN materials are used.

The semiconductor body 40 is typically a wafer stack. Typically, the semiconductor body 40 includes an upper part 60, a lower part 50 and an interface 17 formed by wafer bonding. The lower part 50 includes a first single-crystalline semiconductor region 4 or layer 4 of a second conductivity type (p-type) and a second single-crystalline region or layer 6 of a first conductivity type (n-type). At an interface between the first and the second semiconductor regions 4, 6 a pn-junction 18 is formed. Typically, the pn-junction 18 is orientated parallel to the first surface 15.

It is also possible, that the semiconductor body 40 includes a bulk monocrystalline material and one or more epitaxial layers formed thereon. Using epitaxial layers provides more freedom in tailoring the background doping of the material since the doping concentration can be adjusted during deposition of the epitaxial layer or layers.

According to one embodiment, the semiconductor body 40 further includes a first well 1 and a second well 2 which are both of the first conductivity type (n-type) and extend to the first horizontal surface 15. A non-monocrystalline semiconductor layer or region 3 is embedded within the semiconductor body 40. The non-monocrystalline semiconductor layer 3 is typically orientated parallel to the first surface 15. Typically, the non-monocrystalline semiconductor layer 3 or region 3 is made of poly-Si, α-Si, or stacks thereof. In the following, the non-monocrystalline semiconductor layer 3 and the non-monocrystalline semiconductor region 3 are also referred to as silicon layer and silicon region, respectively.

An insulating region 5, typically a dielectric region made e.g., of $SiO_2$, electrically insulates the first well 1 and the silicon layer 3 from one another. Typically, the insulating region 3 is formed as a dielectric layer 3 which is substantially parallel to the first horizontal surface 15. Further, a vertical trench 35 extends from the first horizontal surface 15 at least to the insulating region 5.

According to one or more embodiments, the first well 1 includes a CMOS-structure for forming a logical circuitry and/or a low power BCD-structure, i.e., a low power Bipolar-CMOS-DMOS-structure, e.g., for forming an analog measuring circuitry. In the context of the present specification the term "low power" intends to describe a power below 10 watts (W), more typically below 1 W, even more typically below 0.5 W. The first well 1 may however also include a power DMOS-structure with low power dissipation, i.e., a power dissipation below 10 W, more typically below 1 W. Due to the insulating region 5 and the trench 35, the first well 1 is electrically insulated from the second well 2. Accordingly, parasitic transistors between the wells 1 and 2 are avoided. Thus, the CMOS-structure and/or the low voltage BCD-structures in the first well 1 are safely decoupled from the lateral power semiconductor structures in the second well 2. The vertical trench 35 includes, in the illustrated vertical cross-section, a first insulating portion 36 and a second insulating portion 37. Accordingly, the first well 1 and the second well 2 are insulated from each other by the insulating region 5 and the insulating portion 37. In one or more embodiments, the insulating region 5, and the insulating portions 36 and 37 are made of $SiO_2$, $Si_3N_4$, or $SiO_xN_y$.

According to one embodiment, a conductive plug 31 is arranged between the first and the second insulating portions 36, 37. In one or more embodiments, the conductive plug 31 is made of a metal such as Al, Ti, W and Cu but may also be made of a material with metallic or near metallic properties with respect to electric conductivity such as highly doped n-type or p-type poly-Si, TiN, carbon or an electrically conductive silicide such as $WSi_2$.

According to one embodiment, the conductive plug 31 electrically connects or grounds the first semiconductor region 4. In the context of the present specification, the terms "in Ohmic contact", "in electric contact", "in contact", and "electrically connected" intend to describe that there is an Ohmic electric connection or Ohmic current path between two regions, portion or parts of a semiconductor devices, in particular a connection of low Ohmic resistance, even if no voltages are applied to the semiconductor device.

Typically, the first well 2 includes a power transistor, e.g., a power MOSFET to which an inductive load is connected. If the inductive load or an ESD pulse causes a high enough negative voltage $V_{inj}$ in the first well 2 during an operating cycle, the diode 13 is switched in forward mode, electrons e⁻ are injected into the first semiconductor region 4 and drained off through the conductive plug 31 to a ground connection (GND) as indicated by the dashed arrows. In so doing, voltage fluctuations of the common substrate formed by the first semiconductor region 4 may be avoided. Depending on the inductive load, large currents up to several amperes may be injected. This may correspond to negative voltage $V_{inj}$ of up to −60 V or even up to −80 V. Typically, a major portion of the current is fed back to the inductive load as indicated by the thick arrow.

In the following, the conductive plug 31 which connects or grounds the first semiconductor region 4 and is laterally insulated, e.g., by first and second insulating portions 36, 37, is also referred to as a laterally insulated conductive plug 30. The laterally insulated conductive plug 30 is arranged between the first and second well 1,2 in all vertical cross-sections 30 through both wells 1,2. In one embodiment, the laterally insulated conductive plug 30 is bar-shaped and extends in a direction which is perpendicular to the illustrated cross-section. In another embodiment, the laterally insulated conductive plug 30 is ring-shaped and arranged around the first well 1 or the second well 2.

According to one embodiment, the non-monocrystalline semiconductor layer 3 is of the first conductivity type (n-type) and has a doping concentration which is lower than the doping concentration of adjoining semiconductor regions, i.e., lower than the doping concentration of the second semiconductor region 6 and the doping concentration of a lower portion of the second well 2 which both adjoin the non-monocrystalline semiconductor layer 3. Typically, the non-monocrystalline semiconductor layer 3 forms a high Ohmic layer. In the context of the present specification, the terms "high Ohmic region", "highly resistive region", "highly resistive layer", and "high Ohmic layer" intend to describe that this region or layer provides an electric connection and current path, respectively, of high resistivity and with a symmetric current-voltage (I-V) curve, between two other regions, portion or parts of a semiconductor device. The doping concentration of the high Ohmic layer 3 is typically at least one order of magnitude lower than the doping concentration of the adjoining semiconductor regions. For example, the doping concentrations of the second semiconductor region 6 and the wells 1 and 2 may be about $2*10^{15}$ cm⁻³ in regions adjoining the high Ohmic layer 3. The high Ohmic layer 3 typically has a doping concentration of less than about $5*10^{14}$ cm⁻³, more typically of less than $5*10^{13}$ cm⁻³, e.g., of about $10^{13}$ cm⁻³. The non-monocrystalline semiconductor layer 3 may e.g., have an intrinsic conductivity.

If an ESD pulse or an energetic electric pulse during operation of the power transistor in the second well 2 causes a negative voltage $V_{inj}$, a part of the charges can be drained off, as indicated by the dashed arrow, through the conductive plug 31 as the high Ohmic layer 3 is not completely insulating. This ensures, that the potential drop across the high Ohmic layer 3 does not exceed the breakdown voltage of the high Ohmic layer 3 and facilitates that the diode 13 is switched in forward bias when ESD pulse or an energetic electric pulses is partly to be discharged. As indicated by the thick arrow, the remaining part of the injected charges e⁻ is typically reinjected into the device the power transistor is driving. The ratio of reinjected charges depends on the resistance relation which may be tailored by the resistivity and vertical thickness of the high Ohmic layer 3. Typically, the vertical extension of the high Ohmic layer 3 or non-monocrystalline semiconductor layer 3 is in range from about 0.2 μm to about 10 μm, more typically from 1 μm to about 4 μm.

In addition, the high Ohmic layer 3 is typically spaced apart from the pn-junction 18 and the adjoining space charge region of the unbiased pn-junction 18. This is to reduce possible leakage currents.

Figure 2:
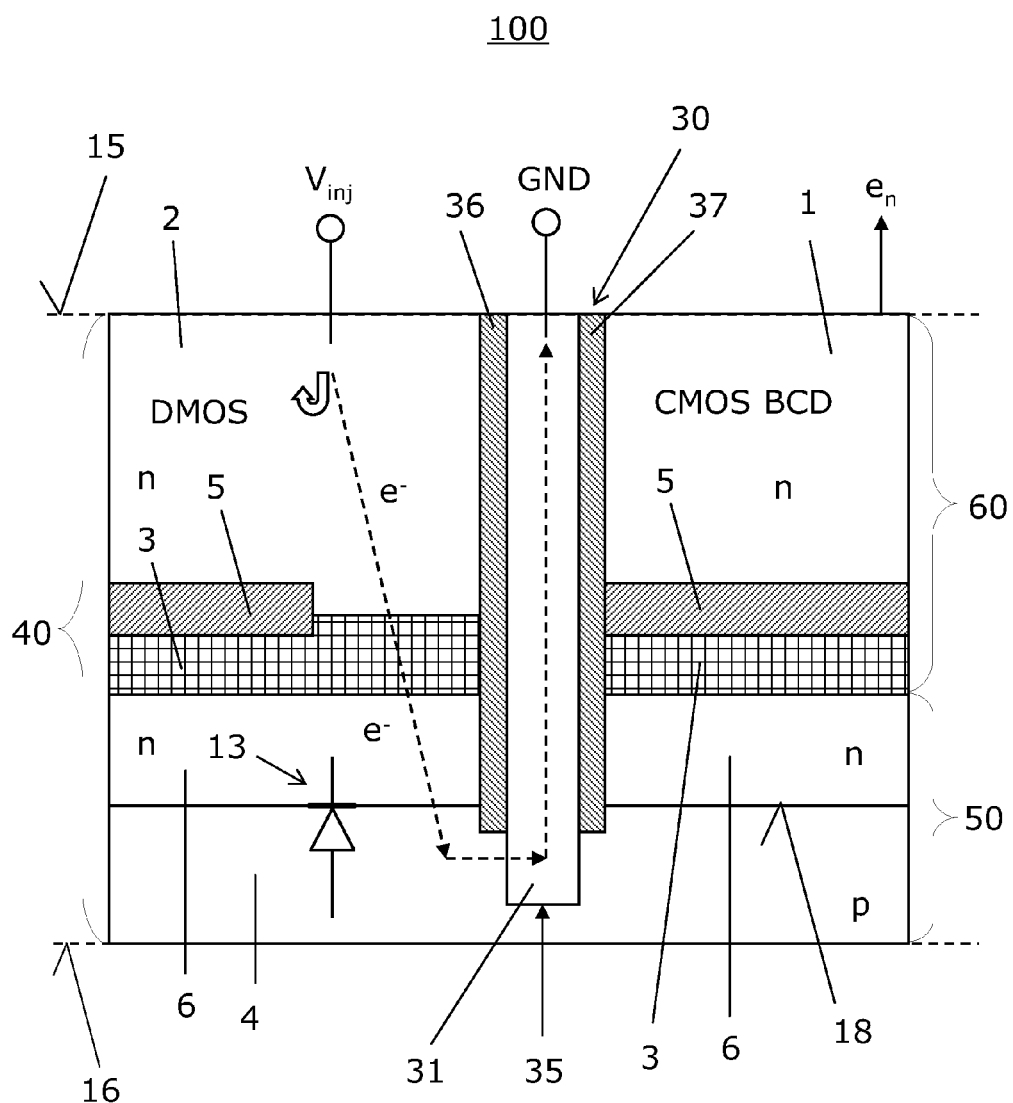
FIG. 2 schematically illustrates a vertical cross-section of a semiconductor device according to one embodiment.

With respect to FIG. 2 further embodiments will be explained. FIG. 2 illustrates one embodiment of a semiconductor device 100 in a section of a vertical cross-section. The semiconductor device 100 of FIG. 2 is similar to the semiconductor device of FIG. 1. In addition, the insulating region 5 partly covers the non-monocrystalline semiconductor layer 3 in the second well 2. The vertical thickness of the insulating regions 5 is typically in a range from about 100 nm to about 2 μm, more typically in a range from about 250 nm to about 750 nm. The vertical thickness of the insulating region 5 may be chosen comparatively small. Still, the potential drop across the high Ohmic layer 3 does not exceed the breakdown voltage of the insulating region 5 in well 2 in the event of an ESD pulse or an energetic electric pulse which may at least partly be discharged through the conductive plug 31. Due to the small vertical thickness of the insulating region 5 in well 2, the thermal resistivity is typically only slightly increased. Thus, good heat dissipation from a power device integrated in the second well 2 through the back surface 16 is typically maintained.

According to one or more embodiments, the semiconductor body 40 includes a partial silicon on insulator ("partial SOI") substrate or wafer. In these embodiments, the insulating region 5 is a buried oxide ("BOX") layer of the partial silicon on insulator substrate or wafer. Typically, the buried oxide layer includes an insulating dielectric material such as $Si_3N_4$, $SiO_2$ and $SiO_xN_y$.

For manufacturing the semiconductor device 100, the buried oxide layer is typically covered with non-monocrystalline semiconductor layer 3 prior to forming a wafer-stack with a handling wafer having a horizontally extending pn-junction. During manufacturing the semiconductor device 100, the insulating region 5 in well 2 reduces the mechanical tensions. Accordingly, dishing of the wafer prior to covering the partial SOI-wafer with the non-monocrystalline semiconductor layer 3 and waver-bonding, respectively, may be avoided by arranging several insulating regions 5 on the wafer.

Figure 3:
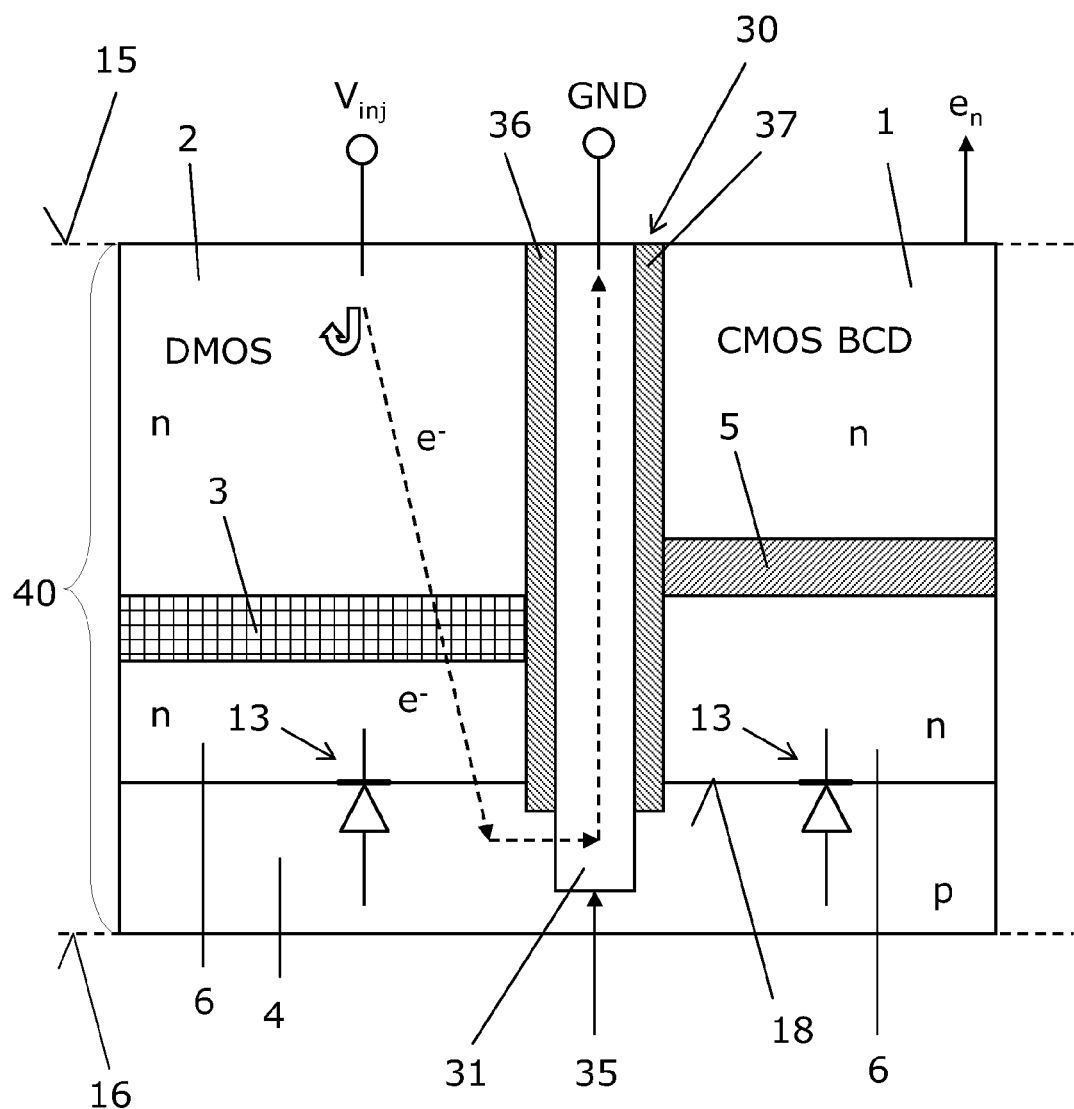
FIG. 3 schematically illustrates a vertical cross-section of a semiconductor device according to one embodiment.

With respect to FIG. 3 further embodiments will be explained. FIG. 3 illustrates an embodiment of a semiconductor device 100 in a section of a vertical cross-section. The semiconductor device 100 of FIG. 3 is similar to the semiconductor device of FIG. 1. However, the non-monocrystalline semiconductor layer 3 only forms an embedded silicon region 3 below the second well 2, i.e., the insulating region 5 below the first well 1 does not adjoin the embedded silicon region 3.

In other words, the semiconductor device 100 of FIGS. 1 to 3 typically include a semiconductor body with a first well 1 and a second well 2 which both extend to the main horizontal surface 15. The first well 1 accommodates a CMOS-structure for forming a digital circuitry and/or a low power BCD-structure e.g., for forming a measuring circuitry. The second well 2 is electrically insulated from the first well 1 and accommodates a DMOS-structure, e.g., a lateral power MOSFET or a lateral power IGBT. An embedded silicon region 3 of poly-Si and/or α-Si is arranged at least below the second well 2.

Silicon region 3 is insulated from the first well 1. Further, a pn-junction is arranged below the embedded silicon region 3.

According to one embodiment, a laterally insulated conductive plug 30 extends from the main horizontal surface 15 through the pn-junction 18. The laterally insulated conductive plug 30 is typically formed in a trench 35 which extends from the main horizontal surface 15 at least through the pn-junction 18. The trench 35 is filled with a conductive plug 31 which connects the first semiconductor region 4 typically forming a common substrate 4. In the illustrated vertical cross-section, the conductive plug 31 is laterally insulated by a first insulating portion 36 and a second insulating portion 37.

Figure 4:
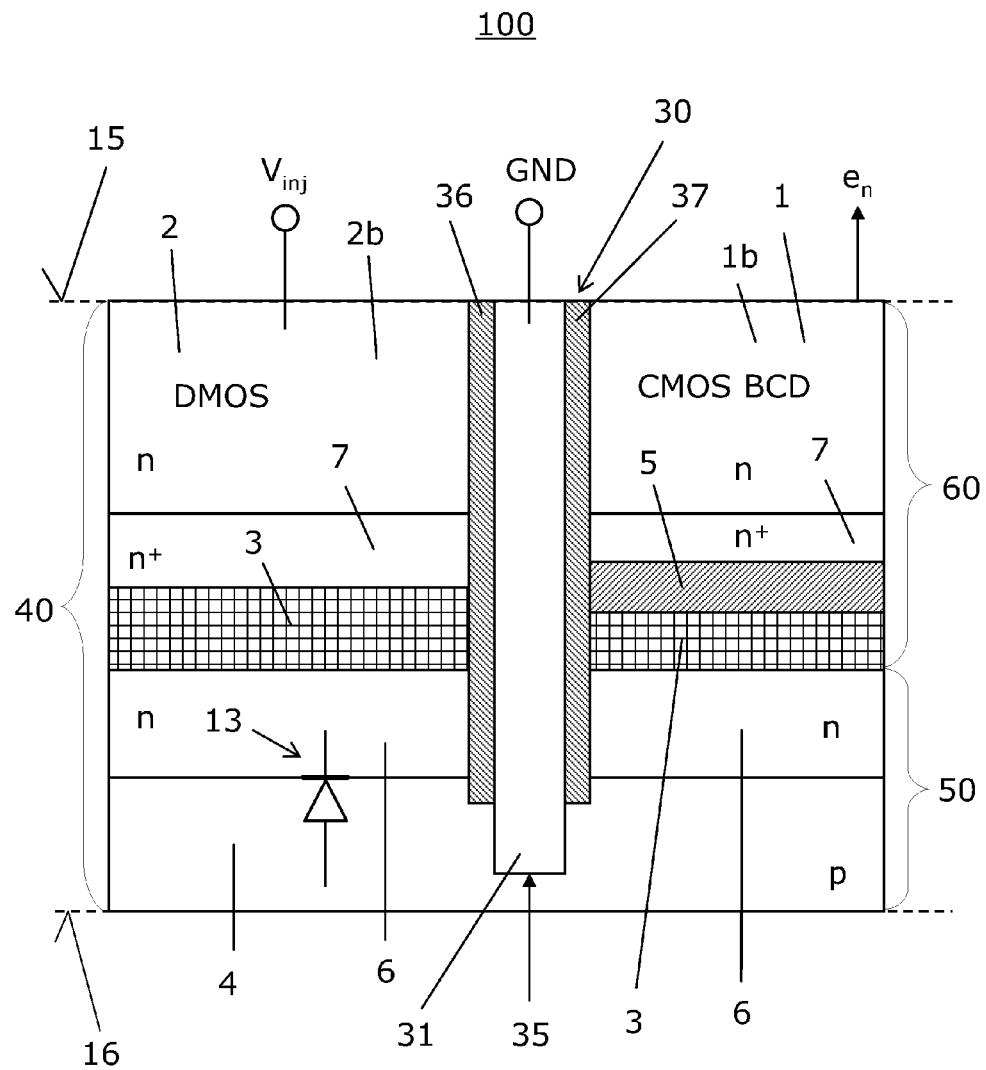
FIG. 4 schematically illustrates a vertical cross-section of a semiconductor device according to one embodiment.

With respect to FIG. 4 further embodiments will be explained. FIG. 4 illustrates one embodiment of a semiconductor device 100 in a section of a vertical cross-section. The semiconductor device 100 of FIG. 4 is similar to the semiconductor device of FIG. 1. In addition, a buried layer 7 of the first conductivity type (n-type) is arranged in a lower part of the first well 1 and/or the second well 2. The buried layer 7 has a doping concentration which exceeds the doping concentration of adjoining semiconductor regions. The buried layer 7 may form a part of a common guard ring structure for further improving the robustness or ruggness against ESD pulses and energetic electric pulses during operation.

Due to the low conductive non-monocrystalline semiconductor layer 3 forming a high Ohmic layer 3, the buried layer 7 need not be as highly doped as in conventional guard ring structures. The doping concentration of the buried layer 7 is typically in a range from about $2*10^{17}$ cm$^{-3}$ to about $5*10^{19}$ cm$^{-3}$.

In the embodiments of FIG. 4, the buried layer 7 adjoins the upper portions of the wells 1 and 2 and the high Ohmic layer 3 below the second well 2. In one embodiment, the doping concentration of the adjoining semiconductor regions of the upper portions 1b, 2b of the wells 1 and 2 is lower and in a range from about $1*10^{14}$ cm$^{-3}$ to about $5*10^{16}$ cm$^{-3}$. The upper portions 1b and 2b include the low power CMOS and/or DMOS structures and lateral power DMOS structures, respectively. In one embodiment, buried layer 7 is at least formed between the insulating region 5 and the upper portion 1a. Accordingly, the sensitive low power CMOS and/or BCD circuitry hosted in upper portion 1b is shielded against any trapped charges in insulating region 5. Thus, a shift of operating points of the CMOS and/or BCD circuitry may be avoided.

In one embodiment or in addition, a further highly doped buried layer may be arranged between high Ohmic layer 3 and the second semiconductor region 6 to form a guard-ring structure.

Figure 5:
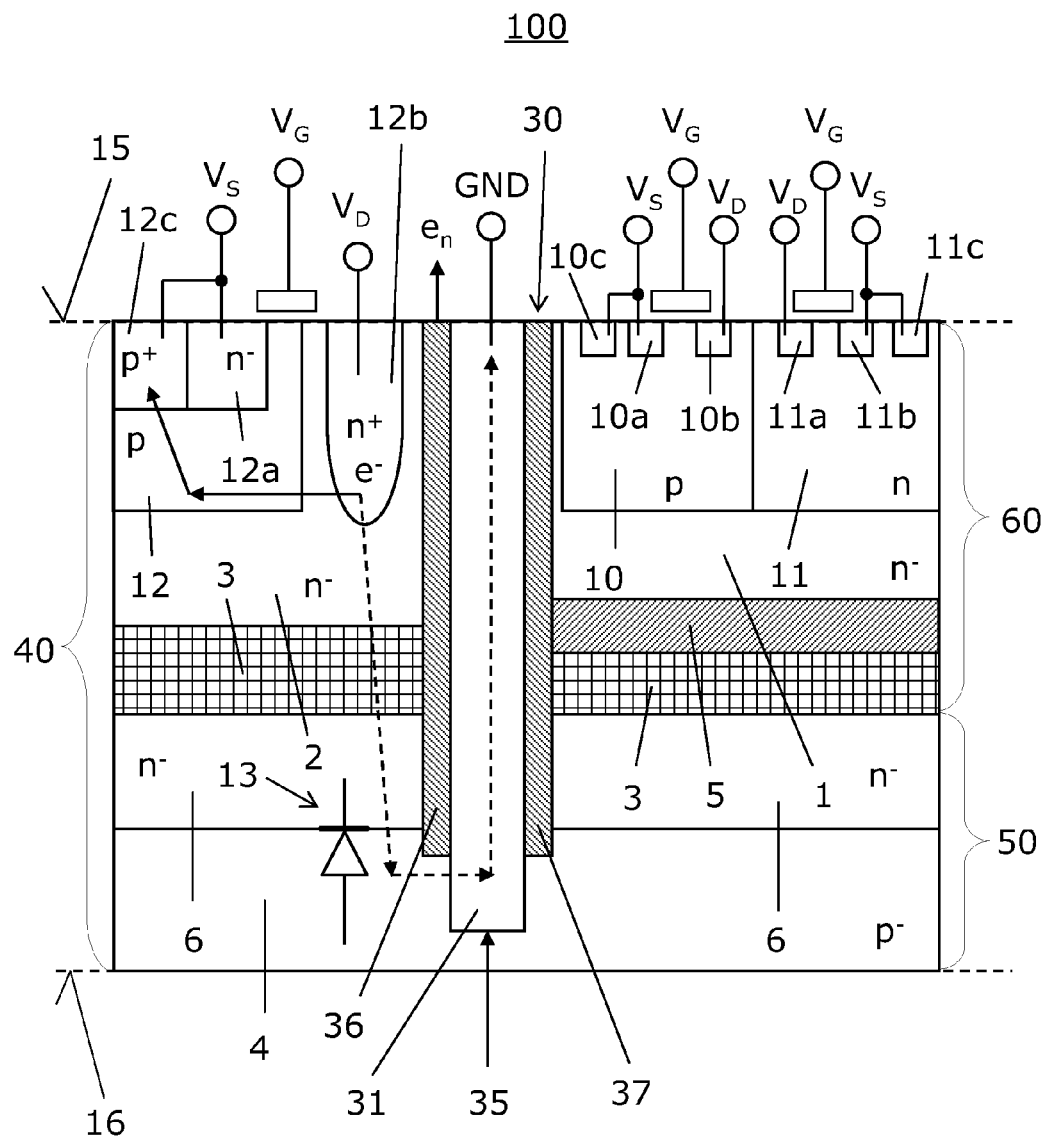
FIG. 5 schematically illustrates a vertical cross-section of a semiconductor device according to one embodiment.

FIG. 5 illustrates one embodiment of a semiconductor device 100 in a section of a vertical cross-section. The semiconductor device 100 of FIG. 5 is similar to the semiconductor device 100 of FIG. 1. In the embodiment illustrated in FIG. 5, the second well 2 includes an exemplary DMOS power transistor having an n$^+$-type drain region 12b connected to a drain potential V$_D$ and a p-type body region 12. The body region 12 accommodates a n$^+$-type source region 12a and a p$^+$-type contact region 12c which are both connected to the source potential V$_S$. The current between the source region 12a and the drain region 12b is typically controlled by the voltage V$_G$ of a gate electrode. To realize a low resistance Ohmic contact, the doping concentration of the p$^+$-type body contact region 12c is typically higher than the doping concentration of the body region 12. In one embodiment, doping concentrations range between about $10^{14}$ cm$^{-3}$ to about $10^{17}$ cm$^{-3}$ for the first (p$^-$) semiconductor region 4, between about $10^{16}$ cm$^{-3}$ to about $10^{20}$ cm$^{-3}$ for the (p$^+$) body contact region 12c, between about $10^{14}$ cm$^{-3}$ to about $10^{17}$ cm$^{-3}$ for the (n) wells 1 and 2 and the (n$^-$) second semiconductor region 6, and between about $10^{17}$ cm$^{-3}$ to about $10^{20}$ cm$^{-3}$ for (n+) drain region 12b and the source region 12a, respectively. The doping concentration of the high Ohmic layer 3 is typically less than the doping concentration of the (n$^-$) wells 1 and 2.

The first well 3 accommodates an exemplary CMOS-structure which consists of a p-channel and an n-channel MOSFET. The n-channel MOSFET includes a p-type body region 10 into which an n$^+$-type source region 10a, an n$^+$-type drain region 10b and a p$^+$-type contact region 10c are processed. The source region 10a and the contact region 10c are connected to a source potential V$_S$ which typically differs from the source potential V$_S$ of the DMOS power transistor. The drain region 10b is connected to a drain potential V$_D$ which is typically different from the drain potential V$_D$ of the DMOS power transistor. The current between the source region 10a and the drain region 10b is typically controlled by the voltage V$_G$ of a gate electrode. Again, the gate voltage V$_g$ of the n-channel MOSFET is typically different from the gate voltage V$_g$ of the DMOS power transistor. The p-channel MOSFET is similar to the n-channel MOSFET. However, the doping types are reversed. The p$^-$-type source region 11a and the n$^+$-type contact region 11c are connected to the source potential V$_S$ which is typically the same as for the p-channel MOSFET. The p$^+$-type drain region 11c is connected to the drain potential V$_D$ which is typically the same as for the p-channel MOSFET. Furthermore, the current between source region 11a and the drain region 11c is also controlled by the gate voltage V$_G$ of the n-channel MOSFET.

In one embodiment, the DMOS power transistor is connected to an inductive load, e.g., an electromotor. If a high enough negative potential is applied to the drain region 12b during operation, such that the pn-junction 13 and the pn-junction between the first well 2 and the body region 12 are switched in forward mode, the injected electron current e$^-$ is partly drained off via the conductive plug 31 as indicated by the dashed arrows, and partly reinjected to the motor via the contact region 12c as indicated by the thick arrow. How much of the electric energy is fed back, depends on the resistance relation between both current paths. This may be tailored by the vertical thickness and or the conductivity of the high Ohmic layer 3. Due to the high Ohmic layer 3, a vertical parasitic pnp-transistor between the semiconductor regions 12, 2 and 4, which may be present in a device without the high Ohmic layer 3, may be avoided or at least suppressed. Furthermore, diffusing of electrons into other wells may be avoided or at least suppressed by the high Ohmic layer 3.

The semiconductor device 100 including the terminals typically form a lateral power integrated circuit with a lateral power device or even a complete lateral power circuit formed by the semiconductor structures of the second well 2 and the respective terminals. The semiconductor structures of the first well 1 and the respective terminals typically form a low power device or a low power circuitry. The low power circuitry may include a logical circuitry and/or a measuring circuitry.

Typically, the cross-section of FIG. 5 represents only a part of the semiconductor device 100. This is explained in more detail with respect to FIG. 6.

Figure 6:
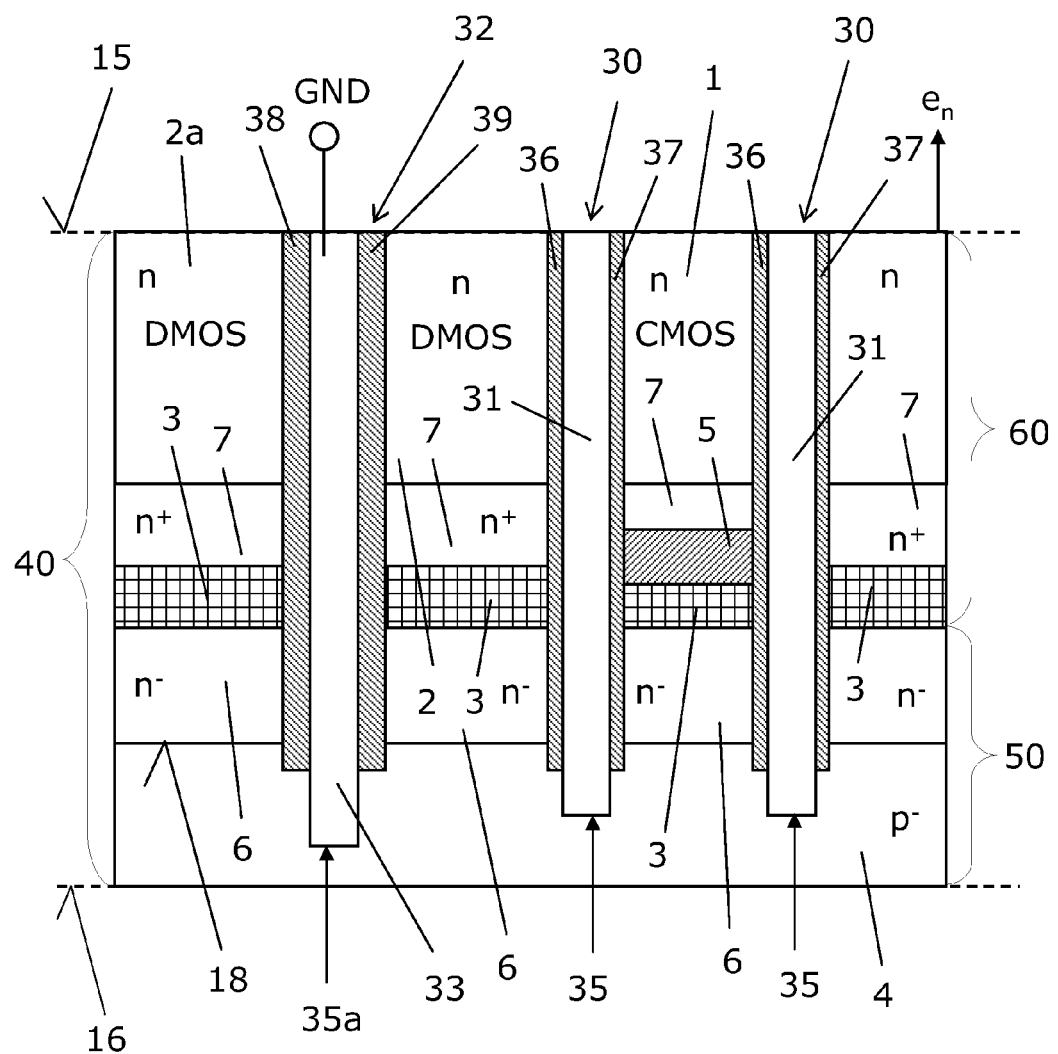
FIG. 6 schematically illustrates a vertical cross-section of a semiconductor device according to one embodiment.

The semiconductor device 100 of FIG. 6 is similar to the semiconductor device illustrated in FIG. 5, but corresponds to a larger section. Further, the semiconductor device 100 of FIG. 6 includes an additional buried layer 7 as explained with reference to FIG. 4.

According to one or more embodiments, the semiconductor device 100 includes two second wells 2 and 2a each of which accommodates a lateral power semiconductor structure, such as a power diode, a power thyristor or a power MOSFET, typically a DMOS-structure.

The first well 1 in FIG. 6 is electrically insulated from the second wells 2, 2a by an insulating region 5 and two laterally insulated conductive plugs 30 which in addition connect the first semiconductor region 4 forming a common substrate 4.

According to one or more embodiments, a further laterally insulated conductive plug 32 separates the two second wells 2, 2a from each other. The laterally insulated conductive plug 32 is formed in a trench 35a which extends from the main surface 15 through the pn-junction 18. The insulated conductive plug 32 includes a conductive plug 33 which is, in the illustrated cross-section, arranged between a first and a second insulating portion 38, 39. The conductive plug 33 connects the common substrate 4 with ground potential. Accordingly, ESD pulse and/or current pulses of e.g., an inductive load which are injected into one of the second wells 2, 2a may be discharged through the plugs 33 and 31, respectively, and/or partly reinjected into the load. Consequently, the DMOS-structure in the respective other second well is not or almost not affected by the current injection. Due to complete electrical insulation of the first well 1 from the second wells 2, 2a, the first well 1 remains also unaffected by the current injection. Thus, the semiconductor device 100 has a high robustness or ruggness against ESD pulses and energetic electric pulses during operation, i.e., a high reverse current stability. Furthermore, any cross-talk between the second wells 2 and 2a may be avoided.

Figure 7:
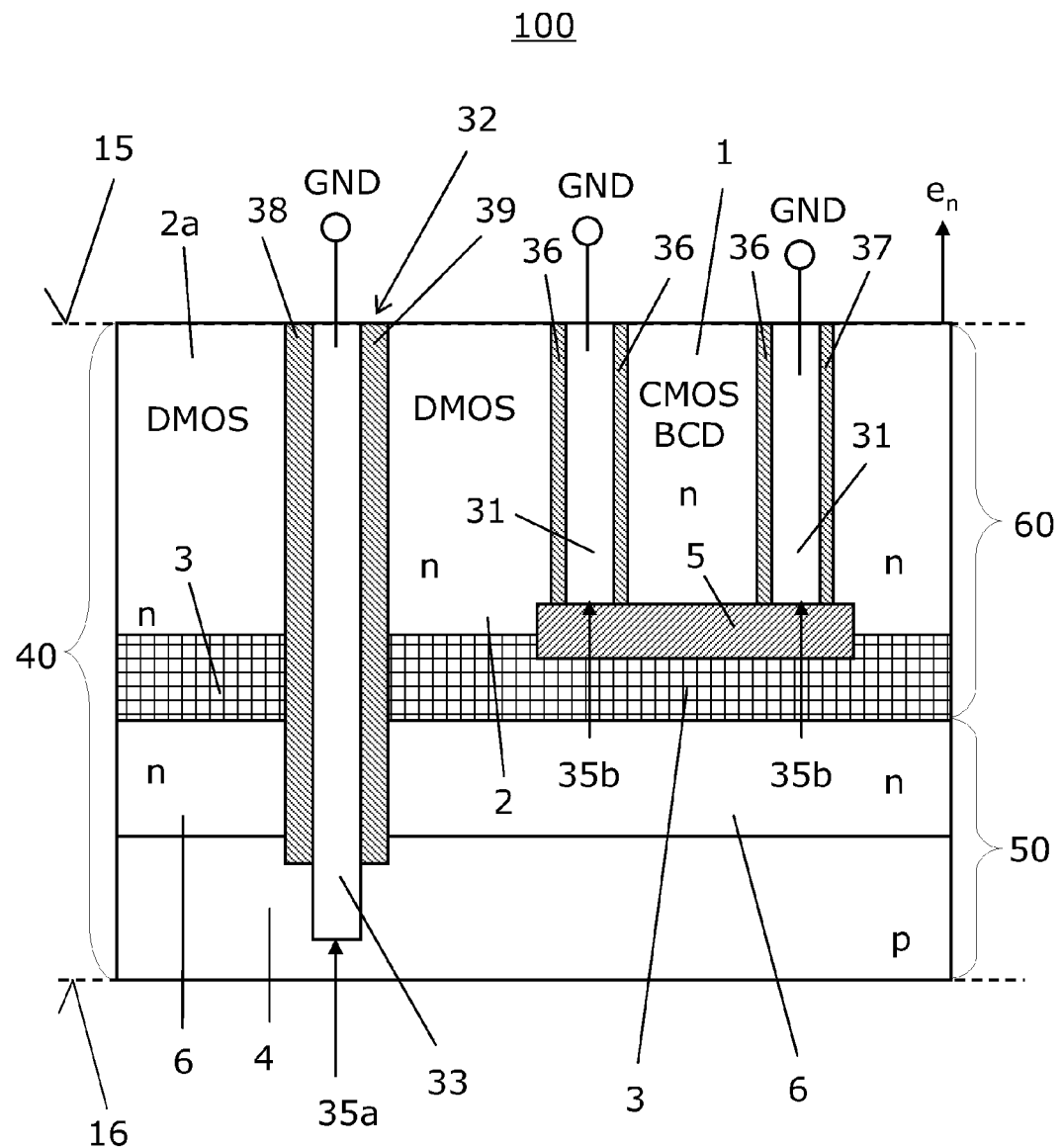
FIG. 7 schematically illustrates a vertical cross-section of a semiconductor device according to one embodiment.

With respect to FIG. 7 further embodiments will be explained. FIG. 7 illustrates an embodiment of a semiconductor device 100 in a section of a vertical cross-section. The semiconductor device 100 of FIG. 7 is similar to the semiconductor device of FIG. 6. However, the optional buried layer is not illustrated. Further, the first well 1 is, in the illustrated cross-section, electrically insulated by an insulating region 5 and two insulated trenches 35b extending from the main horizontal surface 15 to the insulating region 5. Note that the illustrated two insulated trenches 35b may correspond to sections of one simply connected insulated trench 35b.

In other words, the semiconductor device 100 includes a first semiconductor region 6 of a second conductivity type (p-type), a second semiconductor region 4 of a first conductivity type (n-type) which forms a pn-junction with the first semiconductor region. A non-monocrystalline semiconductor layer 3 of the first conductivity type is arranged on the second semiconductor region 5, a first well 1 and one or two second well 2, 2a of the first conductivity type are arranged on the non-monocrystalline semiconductor layer 3 and extending to the main horizontal surface 15. The first well 1 is insulated from the non-monocrystalline semiconductor layer 3 and from the one or more second wells 2, 2a by an embedded insulating region 5 and at least one insulated trench 35b extending from the main horizontal surface to the insulating region 5. The non-monocrystalline semiconductor layer 3 is typically made of poly-Si and/or α-Si.

According to one or more embodiments, a further insulated trench 35a extends from the main horizontal surface 15 partially into the first semiconductor region 6. The further insulated trench 35a includes a conductive plug 33 in Ohmic contact with the first semiconductor region 6. The conductive plug 33 is, in the illustrated cross-section, laterally insulated by two insulating regions 38, 39. In other words, the conductive plug 33 and the insulating regions 38, 39 form a laterally insulated conductive plug 32. As the conductive plug 33 connects the common substrate 4 with ground potential, ESD pulses and/or load related current pulses which are injected into one of the second wells 2, 2a may be discharged through the plug and/or partly reinjected into the load. Accordingly, the semiconductor device 100 of FIG. 7 has also a high robustness or ruggness against ESD pulses and energetic electric pulses during operation.

Figure 8:
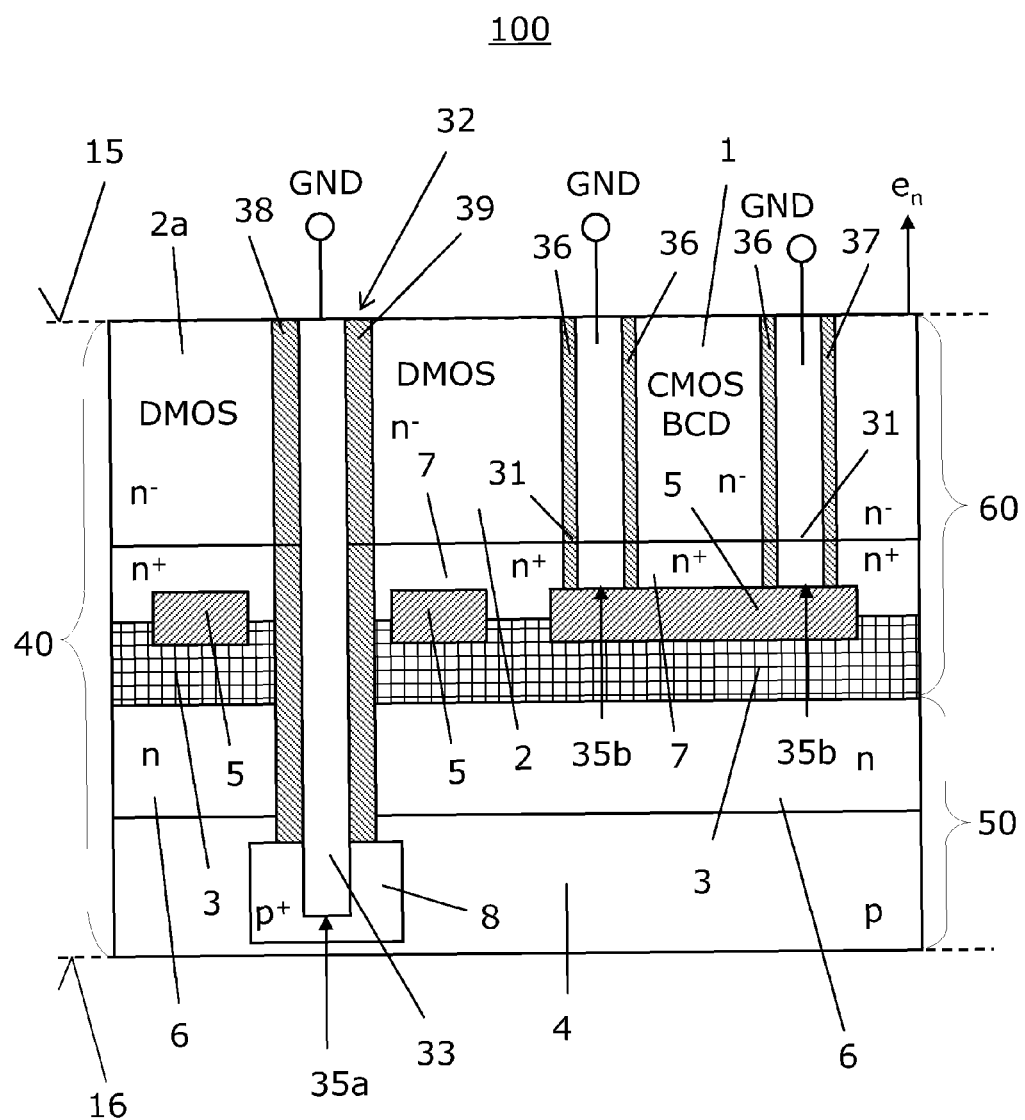
FIG. 8 schematically illustrates a vertical cross-section of a semiconductor device according to one embodiment.

FIG. 8 illustrates one embodiment of a semiconductor device 100 in a section of a vertical cross-section. The semiconductor device 100 of FIG. 8 is similar to the semiconductor device illustrated in FIG. 7. The semiconductor device 100 of FIG. 8 includes additional insulating region 5 in the DMOS-wells 2 and 2a to reduce dishing as explained with reference to FIG. 2. Furthermore, a highly doped p-type contact region 8 is additionally illustrated in FIG. 8. Accordingly, a low Ohmic contact between plug 33 and the common substrate 4 is facilitated. Respective highly doped contact regions may also be used in the semiconductor devices explained with reference to FIGS. 1 to 7 for low Ohmic connecting the common substrate to ground.

With respect to FIGS. 9 to 16 methods for forming a semiconductor device 100 according to several embodiments are illustrated. In a first process, a first monocrystalline n-type silicon wafer 60 is provided. The wafer 60 has a first horizontal surface 15, an opposite horizontal surface 15a, and a semiconductor layer 1b arranged therebetween.

Figure 9:
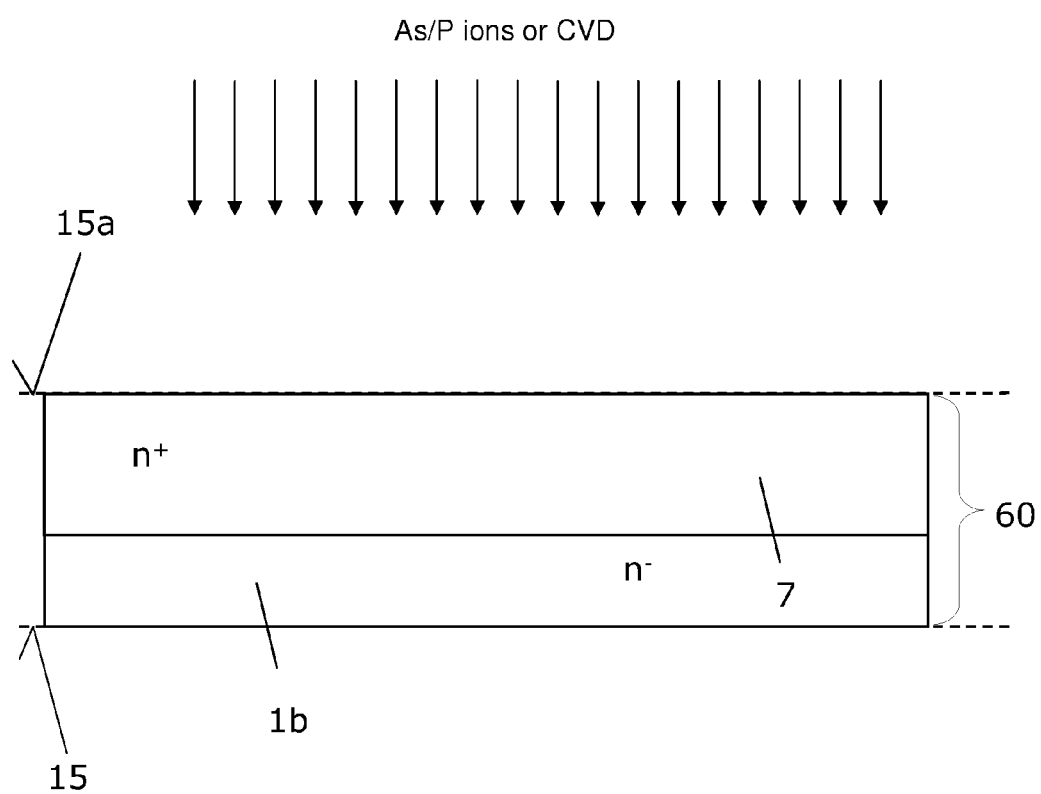
FIGS. 9-16 illustrate manufacturing processes according to one or more embodiments.

In an optional subsequent process, an $n^+$-type second semiconductor layer 7 of higher doping concentration is formed either by implanting of e.g., arsenic (As) or phosphorus (P) or by depositing of a pre-doped semiconductor material using e.g., an epitaxial deposition of silicon or a chemical vapor deposition (CVD) process at the opposite horizontal surface 15a as indicated by the arrows in FIG. 9. In FIGS. 9 to 12 the orientation of structure 100 is upside down compared to the other figures. Typically, an unstructured second semiconductor layer 7 is formed, e.g., by maskless implantation. Portions of the second semiconductor layer 7 typically form a buried layer in lower portions of the later formed wells. In other embodiments, the second semiconductor layer 7 is formed as a structures layer using e.g., a masked implanting process.

Figure 10:
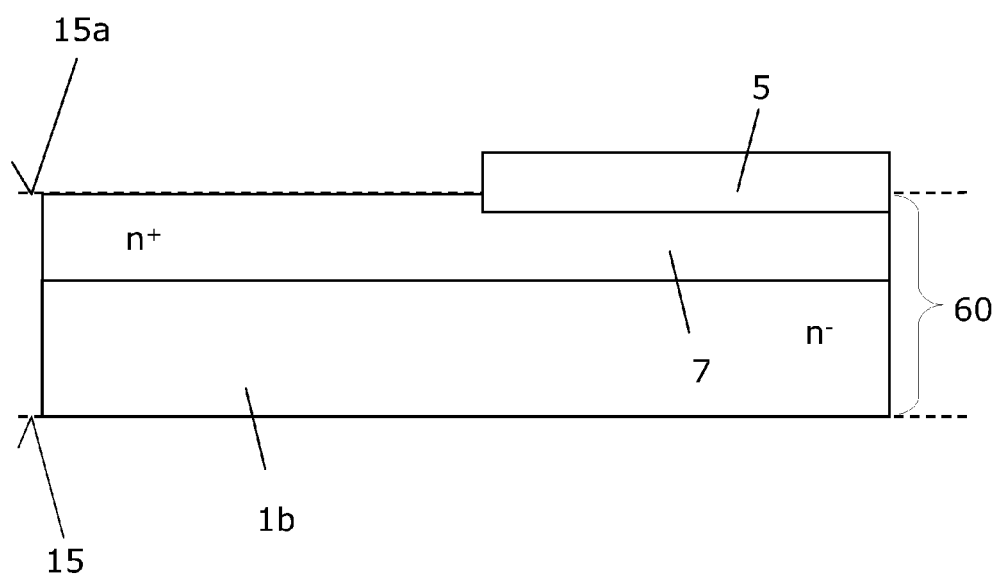

Thereafter, at least one insulating region 5 is formed on the opposite horizontal surface 15a either by a chemical vapor deposition (CVD) process or by thermal oxidation. The resulting structure 100 is illustrated in FIG. 10. To reduce mechanical tensions and wafer dishing, respectively, several insulating regions 5 may be formed on surface 15a. Accordingly, waver handling may be facilitated.

The processes resulting in the structure 100 of FIG. 10 may also be considered as a single process of providing a partial SOI wafer having at least one monocrystalline semiconductor layer 1b, 7 and a partial oxide layer 5 partly covering the semiconductor layer 1b, 7. Again, the higher doped layer 7, which forms a buried layer in the final device, is typically optional.

Subsequently, a non-monocrystalline semiconductor layer 3 is formed on the opposite horizontal surface 15a. As indicated by the arrows in FIG. 10, the non-monocrystalline semiconductor layer is typically formed by depositing a poly-Si-layer 3 and/or an α-Si-layer 3, using e.g., a low pressure CVD process or a sputtering process. The non-monocrystalline semiconductor layer 3 covers at least the semiconductor layer 7 and 1b, respectively, in a device without the semiconductor layer 7.

Figure 11:
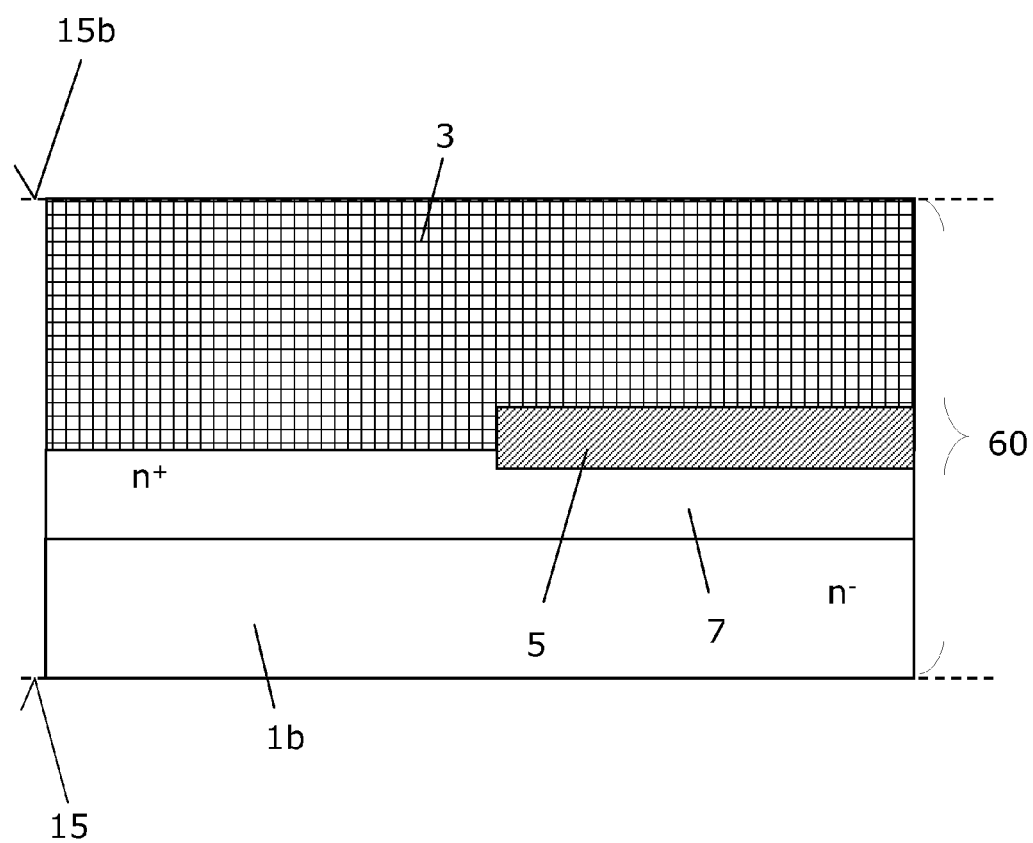

In the embodiment of FIG. 11, the non-monocrystalline semiconductor layer 3 is formed in a maskless process. In so doing, the non-monocrystalline semiconductor layer 3 also covers the insulating region 5 or regions 5. Instead of depositing one non-monocrystalline semiconductor layer 3, a stack of layers which include one or more non-monocrystalline semiconductor layers may be deposited. For example, a first poly-Si-layer or α-Si-layer is deposited. Thereafter, a typically slightly conducting SiC or diamond layer is deposited. Subsequently, a second poly-Si-layer or α-Si-layer is deposited to form a stack with a non-monocrystalline semiconductor layer extending to the top surface. The inner SiC or diamond layer typically increases thermal conductivity. Accordingly, removal of heat may be facilitated.

Figure 12:
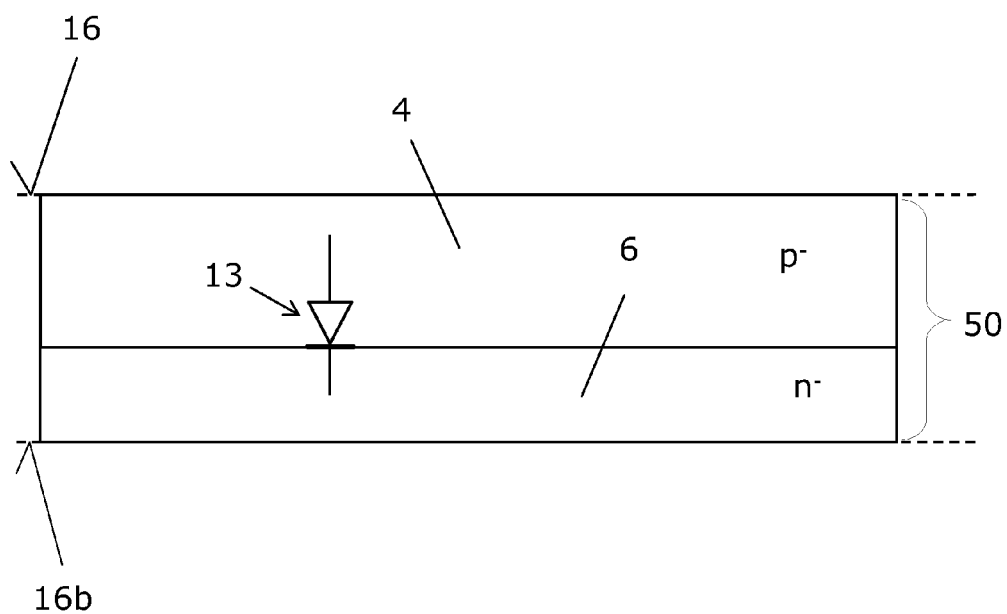
Figure 12:
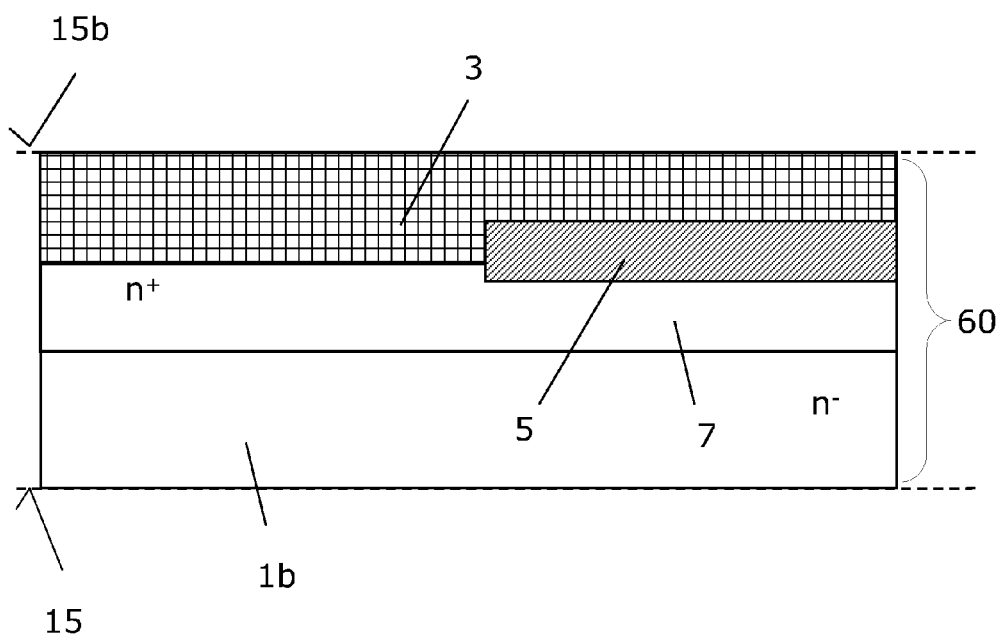

Thereafter, the non-monocrystalline semiconductor layer 3 is planarized and polished, respectively, using e.g., a CMP-process (chemical-mechanical planarization or chemical-mechanical polishing). Accordingly, a surface unevenness resulting e.g., from the protruding insulating region 5 in FIG. 10 are removed. The resulting structure 100 is illustrated in FIG. 12. Due to forming a polished non-monocrystalline semiconductor layer 3 on the opposite horizontal surface a produced back surface 15b suitable for waferbonding is formed.

Subsequently, a second wafer 50 having a horizontally extending pn-junction between a first semiconductor layer or region 4 of the second conductivity type and a second semiconductor region or layer 6 of the first conductivity type is provided for waferbonding with the first wafer 60 as illustrated in FIG. 12. The second wafer 50 is also referred to as handling-wafer 50 and has a bonding surface 16b and a back surface 16 to which the first semiconductor layer 4 extends. In addition, handling-wafer 50 may include an additional $n^+$-type semiconductor layer formed by implanting or depositing on surface 16b for forming a buried layer of a guard-ring structure below the non-monocrystalline semiconductor layer 3.

Figure 13:
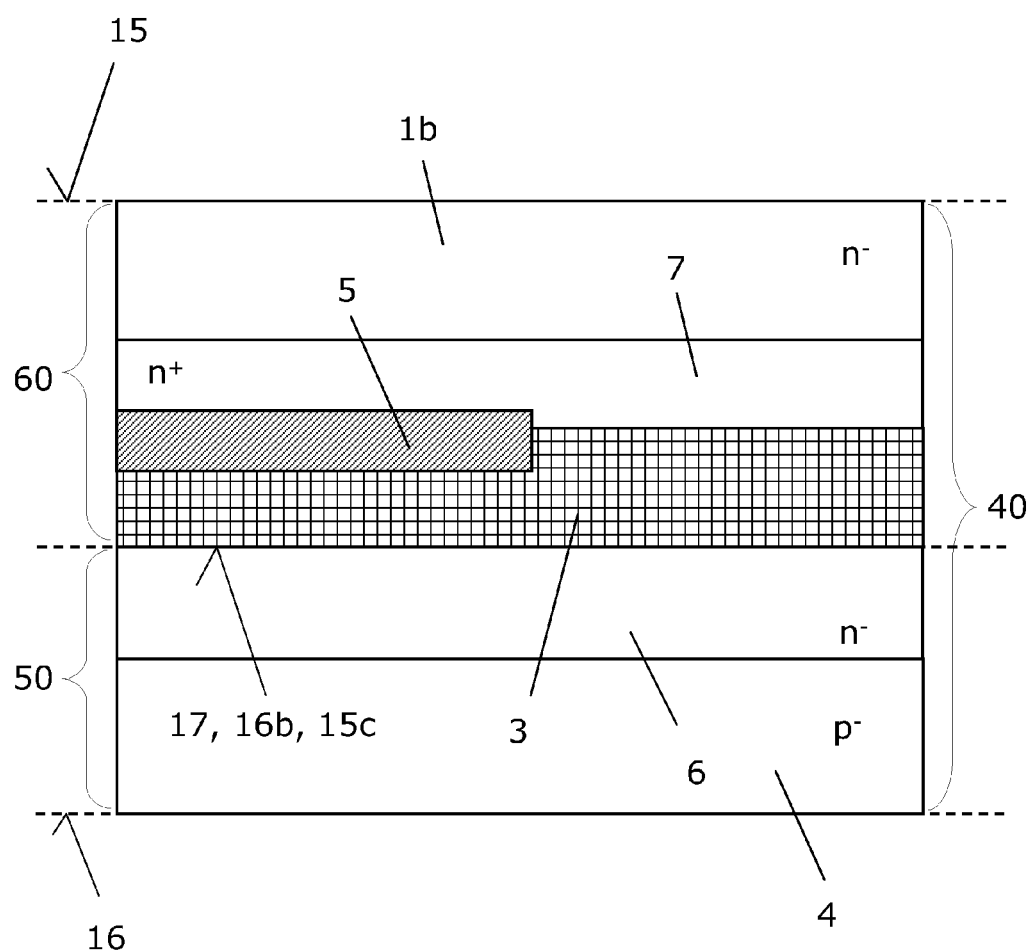

Thereafter a wafer-stack 40 is formed by waferbonding. Typically, the roughness of the respective bond surfaces 15b and 16b is less than around 10 nm. These surfaces are brought into contact with one another and a pressure is applied to bond the two wafers 50, 60 together. The bonded arrangement may then be annealed at a temperature of about 500° C. to about 1200° C. to increase the bond strength. The resulting structure is illustrated in FIG. 13.

The wafer-stack 40 is formed such that the non-monocrystalline semiconductor layer 3 is embedded in the wafer-stack 40. In other words, an interface 17 is formed between the second semiconductor region 6 or layer 6 and the non-monocrystalline semiconductor layer 3 is formed. The wafer-stack 40 has a main horizontal surface 15 which corresponds to the first horizontal surface 15 of the first wafer 60 and a back surface 16 which corresponds to the back surface 16 of the first wafer.

Thereafter, the wafer-stack 40 may be suitably thinned at the main horizontal surface 15.

Figure 14:
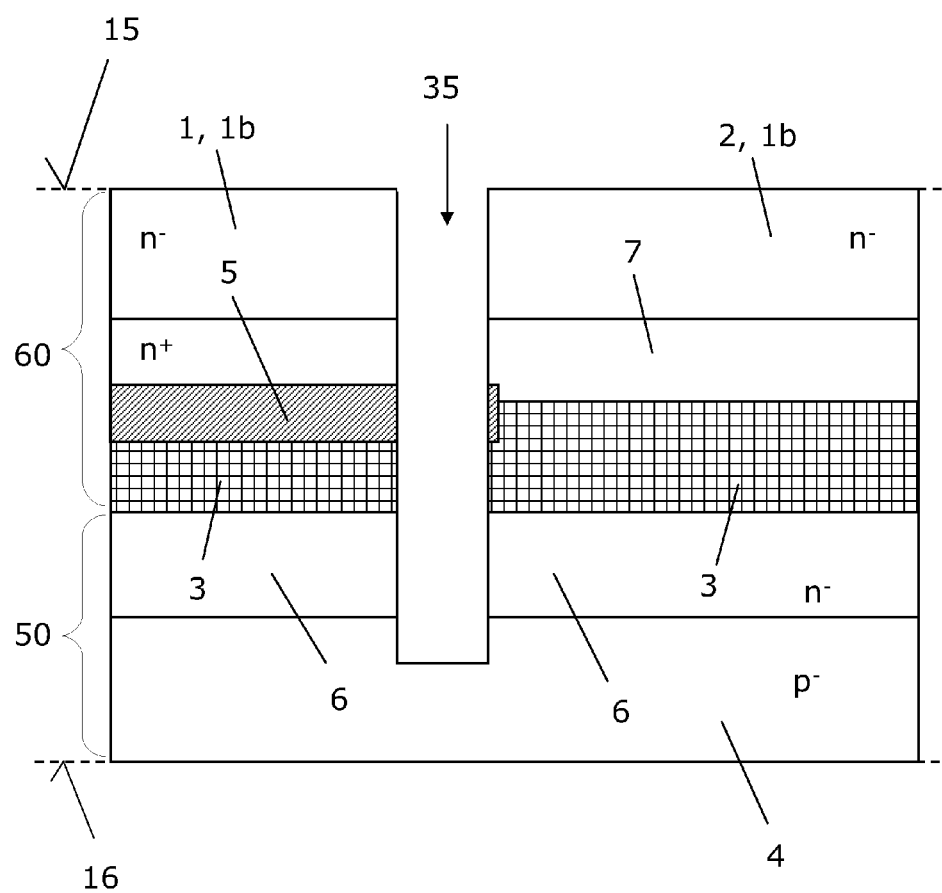

According to one embodiment, at least one vertical trench 35 is etched from the main horizontal surface 15 at least through the semiconductor layers 1b and 7 at least to insulating region 5. Accordingly, a first well 1 and a second well 2 are formed in the semiconductor layer 1b. The resulting structure 100 is illustrated in FIG. 14. Typically, two vertical trenches 35 are formed to insulate the first well at both lateral sides.

The trench 35 may extend into the first semiconductor region 4, i.e., below the pn-junction, for electrically connecting the first semiconductor region 4. In one embodiment, and/or in addition a further vertical trench may be etched from the main horizontal surface 15 through the second well 2, the non-monocrystalline semiconductor layer 3, the second semiconductor layer or region 6 and partially into the first semiconductor region 4 for connecting the first semiconductor region 4. In so doing, two second wells as illustrated in the devices of FIG. 6 to 8 may be formed.

Figure 15:
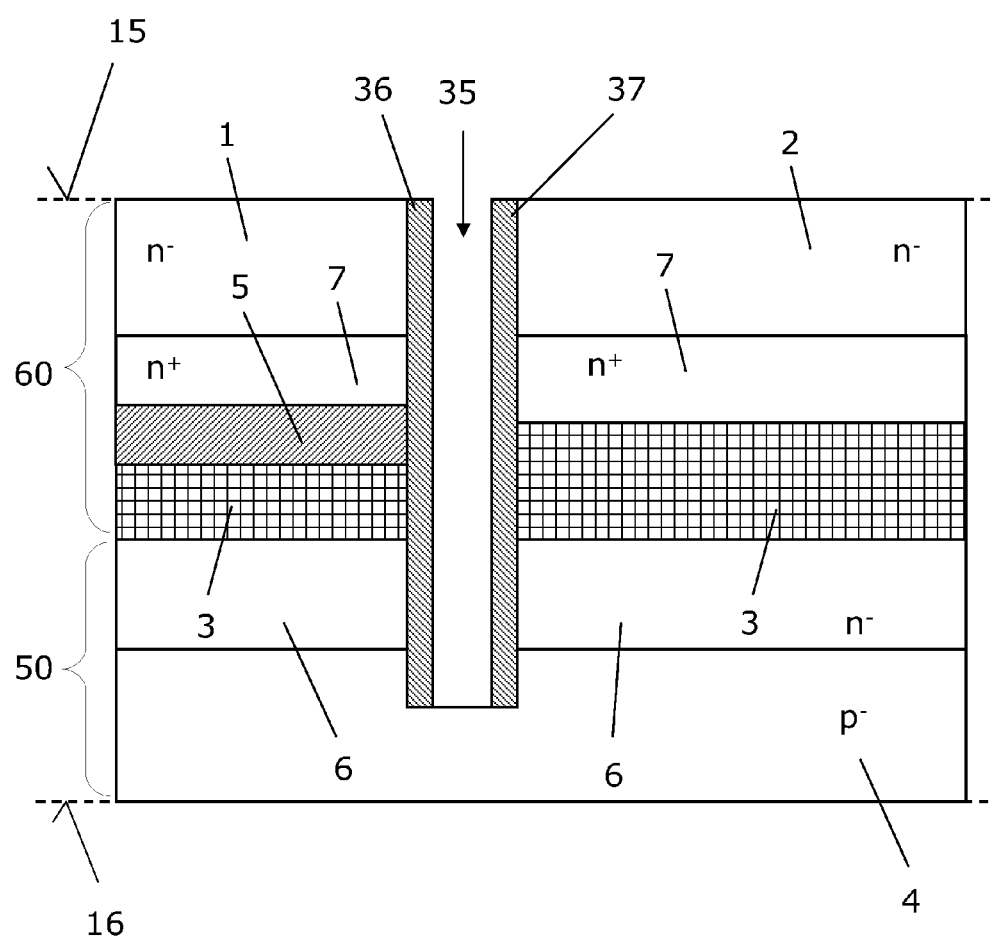

Thereafter, the lateral walls or side walls of the trench 35 or trenches 35 are insulated by dielectric layers. This may be done by thermal oxidation or by a CVD process and a further anisotropic etching process to remove the insulating region on the trench bottom. The resulting structure 100 is illustrated in FIG. 15. In the cross-section of FIG. 15, a first insulating portion 36 and a second insulating portion 37 are illustrated. In case that a further vertical trench has been etched in the process illustrated in FIG. 14, the lateral walls of the further vertical trench are typically insulated at the same time as the lateral walls of the trench 35. In case the trench extends only to the insulating region 5, the process of forming an insulating region on the trench bottom is typically omitted.

Figure 16:
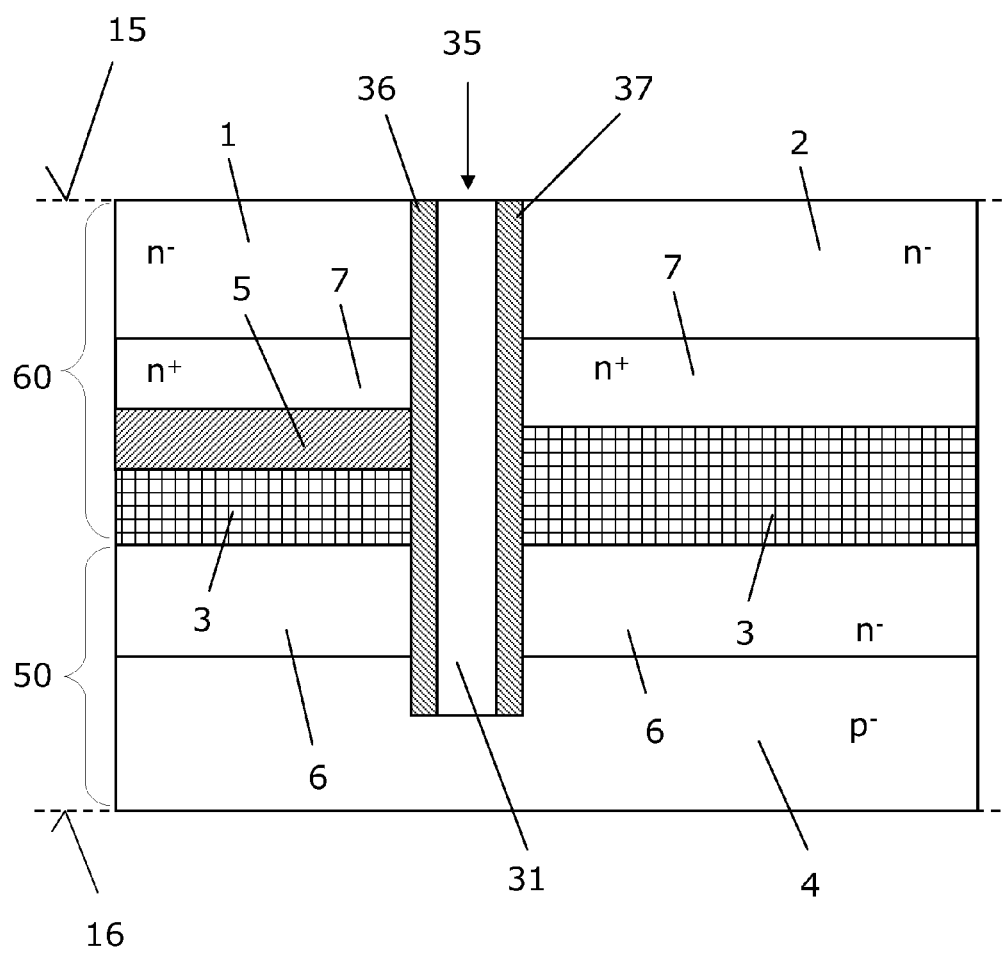

Thereafter, the trench 35 is filled with an electrically conductive material, e.g., by depositing and back-etching of highly doped poly-Si. Accordingly, a conductive plug 31 is formed in the trench 35 which connects the first semiconductor region 4. The resulting structure 100 is illustrated in FIG. 16. In case a further vertical trench has been etched as explained with reference to FIG. 15, the further vertical trench is typically filled with the conductive material at the same time. Accordingly, an insulated conductive plug arranged between two second wells may be formed.

Thereafter, a CMOS-structure and/or a low-voltage BCD-structure are typically formed in the first well 1 using standard semiconductor technology. Further, a power DMOS-structure is typically formed in the second well 2.

Thereafter, electrical contacts and wirings, respectively are typically formed on or close to the main horizontal surface 15. The semiconductor structures of the first well 1 may be wired to from a digital circuitry such as a logical circuitry and or an analog measuring circuitry. The semiconductor structures of the second well 2 are typically wired to form an analog circuitry capable of switching and/or controlling high power devices such as an electromotor. Accordingly, a lateral power integrated circuit, respectively, may be formed. As explained above, the lateral power integrated circuit has a high robustness or ruggness against ESD pulses and energetic electric pulses during operation. Source and drain contacts and/or emitter and collector contacts, and/or cathode and anode contacts are typically formed on main horizontal surface 15 by providing respective metallization pads. Furthermore, insulated gate electrodes are typically formed on main surface 15 or in trenches extending from main surface 15 into the first and/or second wells 1,2 by providing insulating layers and metallization pads or plugs.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the features of the various exemplary embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated semiconductor device, comprising:
a semiconductor body, comprising:
a first semiconductor region of a second conductivity type,
a second semiconductor region of a first conductivity type forming a pn-junction with the first semiconductor region;
a non-monocrystalline semiconductor layer of the first conductivity type arranged on the second semiconductor region;
a first well and at least one second well of the first conductivity type arranged on the non-monocrystalline semiconductor layer and extending to a main horizontal surface; and
an insulating structure insulating the first well from the at least one second well and the non-monocrystalline semiconductor layer,
wherein the non-monocrystalline semiconductor layer is in Ohmic contact with the at least one second well.

2. The semiconductor device of claim 1, wherein the insulating structure
comprises:
an insulating region; and
an insulated trench extending from the main horizontal surface at least to the insulating region.

3. The semiconductor device of claim 1, comprising at least one of:
a dielectric region arranged between the at least one second well and the non-monocrystalline semiconductor layer; and
a laterally insulated conductive plug extending from the main horizontal surface through the pn-junction and electrically contacting the first semiconductor region.

4. A lateral power integrated circuit having a semiconductor body,
comprising:
a first well of a first conductivity type and a second well of the first conductivity type extending to a first horizontal surface, the second well comprising a lateral power semiconductor structure, the first well comprising a buried layer of the first conductivity type in a lower portion, the buried layer comprising a doping concentration which exceeds the doping concentration of an adjoining upper portion of the first well;
a first semiconductor region of a second conductivity type extending to a second horizontal surface which is opposite to the first horizontal surface;
a silicon layer arranged between the first horizontal surface and the first semiconductor region, the silicon layer comprising at least one of poly-Si and α-Si;
an insulating region insulating the first well and the silicon layer from one another;
a vertical trench insulating the first and the second well from one another, and extending from the first horizontal surface at least to the insulating region; and
a second semiconductor region of the first conductivity type arranged between the first semiconductor region and the silicon layer,
wherein the silicon layer is not arranged in the vertical trench.

5. The lateral power integrated circuit of claim 4, wherein the silicon layer is of the first conductivity type and comprises a doping concentration which is lower than the doping concentration of adjoining semiconductor regions.

6. The lateral power integrated circuit of claim 4, wherein the silicon layer comprises an intrinsic conductivity.

7. The lateral power integrated circuit of claim 4, wherein the insulating region is formed by a layer which is substantially parallel to the first horizontal surface.

8. The lateral power integrated circuit of claim 4, wherein the semiconductor device comprises a partial silicon on insulator substrate and wherein the insulating region is a buried oxide layer of the partial silicon on insulator substrate.

9. The lateral power integrated circuit of claim 4, wherein the vertical trench comprises, in a vertical cross-section, a first insulating portion and a second insulating portion, and wherein a conductive plug is arranged between the first insulating portion and the second insulating portion.

10. The lateral power integrated circuit of claim 9, wherein the conductive plug is electrically connected to the first semiconductor region.

11. The lateral power integrated circuit according to claim 4, wherein the lateral power semiconductor structure is a DMOS-structure.

12. The lateral power integrated circuit according to claim 4, wherein the first well comprises at least one of a CMOS-structure and a low power BCD-structure.

13. The lateral power integrated circuit according to claim 4, further comprising a source contact and a drain contact which are both arranged on the first horizontal surface, and/or an emitter contact and a collector contact which are both arranged on the first horizontal surface.

14. A power semiconductor device, comprising:
a semiconductor body, comprising:
a main horizontal surface;
a back surface arranged opposite to the main horizontal surface;
a first well extending to the main horizontal surface and comprising at least one of a CMOS-structure and a low power BCD-structure;
a second well extending to the main horizontal surface, the second well being insulated from the first well and comprising a DMOS-structure;
an embedded silicon region comprising at least one of poly-Si and α-Si, the embedded silicon region being arranged below the first well, and being insulated from the first well; and
a pn-junction arranged below the embedded silicon region and between the embedded silicon region and the back surface.

15. The power semiconductor device of claim 14, further comprising a laterally insulated conductive plug extending from the main horizontal surface through the pn-junction and electrically contacting the first semiconductor region.

16. The power semiconductor device of claim 14, wherein at least one of the first well and the second well further comprises a buried layer of the first conductivity type, the buried layer comprising a doping concentration which exceeds the doping concentration of adjoining semiconductor regions.

17. The semiconductor device of claim 1, wherein the non-monocrystalline semiconductor layer has a doping concentration of less than about $5*10^{14}$ cm$^{-3}$.

18. The semiconductor device of claim 1, wherein the non-monocrystalline semiconductor layer adjoins the at least one second well.

19. The semiconductor device of claim 1, wherein the insulating structure comprises in a vertical cross-section orthogonal to the main horizontal surface:
- an insulating region arranged below the first well and having, in a horizontal direction parallel to the main horizontal surface, an extension which is equal to or larger than an extension of the first well in the horizontal direction; and
- an insulating portion extending from the main horizontal surface at least to the insulating region.

20. The semiconductor device of claim 14, wherein the embedded silicon region is spaced apart from the main horizontal surface.

* * * * *